United States Patent [19]

Tsuyuki

[11] Patent Number: 5,378,662
[45] Date of Patent: Jan. 3, 1995

[54] GLASS, DIELECTRIC COMPOSITION, MULTILAYER WIRING SUBSTRATE, AND MULTILAYER CERAMIC CAPACITOR

[75] Inventor: Hiroshi Tsuyuki, Chiba, Japan

[73] Assignee: TDK Corporation, Tokyo, Japan

[21] Appl. No.: 83,527

[22] Filed: Jun. 30, 1993

[30] Foreign Application Priority Data

Jun. 30, 1992 [JP] Japan .................. 4-196289

[51] Int. Cl.6 ................... C03C 8/14; C03C 14/00; C03C 3/253; C03C 3/15
[52] U.S. Cl. ........................ 501/17; 501/32; 501/42; 501/50; 501/64; 501/73
[58] Field of Search ............... 501/17, 32, 42, 50, 501/64, 73

[56] References Cited

U.S. PATENT DOCUMENTS

| | | | |
|---|---|---|---|
| 2,805,166 | 9/1957 | Löffler | 501/73 |
| 3,501,322 | 3/1970 | Dumbaugh, Jr. et al. | 501/64 |
| 3,778,285 | 12/1973 | Mason | 501/32 X |
| 3,796,047 | 10/1973 | Dumbaugh, Jr. | 501/42 |
| 3,977,887 | 8/1976 | McIntosh | |
| 4,061,584 | 12/1977 | Girard et al. | 501/32 X |
| 4,071,881 | 1/1978 | Bacher | 501/32 |
| 4,335,216 | 6/1982 | Hodgkins et al. | 501/32 |
| 4,798,768 | 1/1989 | Oversluizen et al. | 501/50 |
| 4,999,321 | 3/1991 | Kohli | 501/42 |
| 5,073,523 | 12/1991 | Yamada et al. | 501/32 |

FOREIGN PATENT DOCUMENTS

| | | | |
|---|---|---|---|
| 0014402 | 5/1973 | Japan | 501/50 |
| 50-119815 | 9/1975 | Japan . | |
| 61-29632 | 10/1981 | Japan | 501/73 |
| 0060639 | 4/1983 | Japan | 501/64 |
| 0069440 | 4/1984 | Japan | 501/73 |
| 0069442 | 4/1984 | Japan | 501/73 |
| 0727586 | 4/1980 | U.S.S.R. | 501/64 |

Primary Examiner—Karl Group
Assistant Examiner—David Sample
Attorney, Agent, or Firm—Oblon, Spivak, McClelland, Maier & Neustadt

[57] ABSTRACT

A glass comprising 10–40 mol % as $Ln_2O_3$ of a lanthanide oxide wherein Ln is a lanthanide element, 30–60 mol % as $SiO_2$, $B_2O_3$ and $GeO_2$ in total of silicon dioxide, boron oxide and/or germanium oxide, and 16–40 mol % as $Al_2O_3$ of aluminum oxide has high Tg, a low average coefficient of linear expansion and a high dielectric constant. A dielectric composition containing the glass and a dielectric material is useful in the fabrication of multilayer wiring substrates and multilayer ceramic capacitors.

10 Claims, 1 Drawing Sheet

GLASS, DIELECTRIC COMPOSITION, MULTILAYER WIRING SUBSTRATE, AND MULTILAYER CERAMIC CAPACITOR

BACKGROUND OF THE INVENTION

1. Field of the Invention

This invention relates to a glass and a dielectric composition containing the same. It also relates to a multilayer wiring substrate and multilayer ceramic capacitor which are prepared using the dielectric composition.

2. Prior Art

Known substrate materials for forming wiring boards for use in electric and electronic equipment include a recently developed, low-temperature firing material in the form of a mixture of a glass frit having a softening point of about 700° to 900° C. and aluminum oxide. This substrate material can be fired concurrently and integrally with conductors, resistors and the like at relatively low temperatures of, for example, up to 1,000° C.

It was proposed to incorporate dielectric layers having a high dielectric constant in multilayer wiring substrates made of such low-temperature firing substrate materials, thereby building capacitors in the substrates while achieving a size reduction. Typical dielectric layer materials are lead series low-temperature firing dielectric materials (Pb series perovskite compounds) which can be co-fired with the low-temperature firing substrate materials. This system suffers from serious interdiffusion between the dielectric material and the substrate material. One solution is to provide an intermediate layer, but the system still remains unstable and far below the practically acceptable level.

A variety of mixtures of a ceramic filler and glass were proposed as the dielectric composition which can be fired concurrently and integrally with low-temperature firing substrate materials. The glass materials used heretofore are those of lead oxide, silicon dioxide and boron oxide base systems which have several disadvantages including a low dielectric constant, a low glass transition temperature (Tg), and a high average coefficient of linear expansion causing cracks at the interface with the substrate due to thermal strains. For example, Japanese Patent Application Kokai (JP-A) No. 119815/1975 discloses a ceramic composition comprising in admixture polycrystalline ceramic refractory material and interstitial glass. This ceramic composition has a high dielectric constant and is sinterable at relatively low temperatures. The interstitial glass disclosed therein is a lead oxide series glass such as $PbO-SiO_2$, $PbO-Al_2O_3-SiO_2$ and $PbO-ZrO_2-SiO_2$. Such a composition cannot meet all the requirements of dielectric constant, Tg, and an average coefficient of linear expansion.

SUMMARY OF THE INVENTION

Therefore, an object of the present invention is to provide a novel glass for use in a dielectric composition having a high glass transition temperature (Tg), a low average coefficient of linear expansion, and a high dielectric constant. Another object is to provide a dielectric composition containing such glass. A further object is to provide a multilayer wiring substrate which is prepared by concurrently and integrally firing the dielectric composition and a substrate material as well as a multilayer ceramic capacitor which is prepared using the dielectric composition and has high thermal shock resistance.

According to a first aspect of the invention, there is provided a glass for use in a dielectric composition. The glass contains 10 to 40 mol % calculated as $Ln_2O_3$ of a lanthanide oxide wherein Ln is a lanthanide element, 30 to 60 mol % calculated as $SiO_2$, $B_2O_3$ and $GeO_2$ in total of at least one glass-forming oxide selected from the group consisting of silicon dioxide, boron oxide and germanium oxide, and 16 to 40 mol % calculated as $Al_2O_3$ of aluminum oxide. In preferred embodiments, the glass contains the lanthanide oxide, glass-forming oxide, and aluminum oxide in a total amount of at least 80 mol %. The glass may further contain up to 20 mol % calculated as $Bi_2O_3$ and PbO in total of at least one oxide selected from bismuth oxide and lead oxide. The glass has a glass transition temperature of at least 600° C., an average coefficient of linear expansion of up to $7 \times 10^{-6}$/deg. at 25° to 500° C., and a specific inductive capacity of at least 10.

According to a second aspect of the invention, there is provided a dielectric composition comprising the above-defined glass and a dielectric material having a higher specific inductive capacity than the glass. Preferably, the volume ratio of the glass to the dielectric material is from 8/2 to 4/6.

According to a third aspect of the invention, there is provided a multilayer wiring substrate which is prepared by concurrently and integrally firing a substrate-forming composition containing glass and aluminum oxide filler and the above-defined dielectric composition.

According to a fourth aspect of the invention, there is provided a multilayer ceramic capacitor which is prepared by using the above-defined dielectric composition.

ADVANTAGES

Among the fillers for prior art multilayer wiring substrates, alumina having a low dielectric constant is often used for reducing stray capacity. Alumina is mixed with glass to form a substrate material which can be fired at low temperatures. Alumina has a lower average coefficient of linear expansion than dielectric materials. Therefore, in order that a low-temperature firing substrate material based on alumina and glass and a dielectric composition based on a dielectric material and glass be concurrently fired to produce a multilayer wiring substrate having substrate layers and dielectric layers, it is necessary to select a glass having a Low average coefficient of linear expansion as the glass in the dielectric composition such that the dielectric layers may have an average coefficient of linear expansion close to that of the substrate layers for preventing separation. However, prior art glass has the ambivalence that an average coefficient of linear expansion can be lowered at the sacrifice of a dielectric constant. If glass has a low dielectric constant, then the dielectric layer containing the same will have a low dielectric constant, which requires a multilayer wiring substrate to be increased in size. Inversely, if glass having a higher dielectric constant is selected, the glass is prematurely sintered due to its low Tg, leading to potential separation of the dielectric layer or warpage of the substrate.

In contrast, the glass of the invention has a low average coefficient of linear expansion, high Tg, and yet a high dielectric constant probably because it contains a specific amount of lanthanide. Therefore, by using a dielectric composition containing this glass, a multilayer wiring substrate of high performance can be prepared to a small size without drawbacks such as delamination and warpage.

The glass of the invention can have an appropriate Tg by a proper choice of its composition within the above-defined range. Then a dielectric composition having the glass mixed with a dielectric material can be fired at temperatures of lower than 1,000° C., that is, concurrently with a low-temperature firing substrate material.

A multilayer ceramic capacitor prepared from a dielectric composition having a low average coefficient of linear expansion is fully resistant against thermal shocks and free from crack occurrence at abrupt temperature changes as encountered on soldering and service use.

BRIEF DESCRIPTION THE DRAWINGS

DETAILED DESCRIPTION OF THE INVENTION

Figure 1:
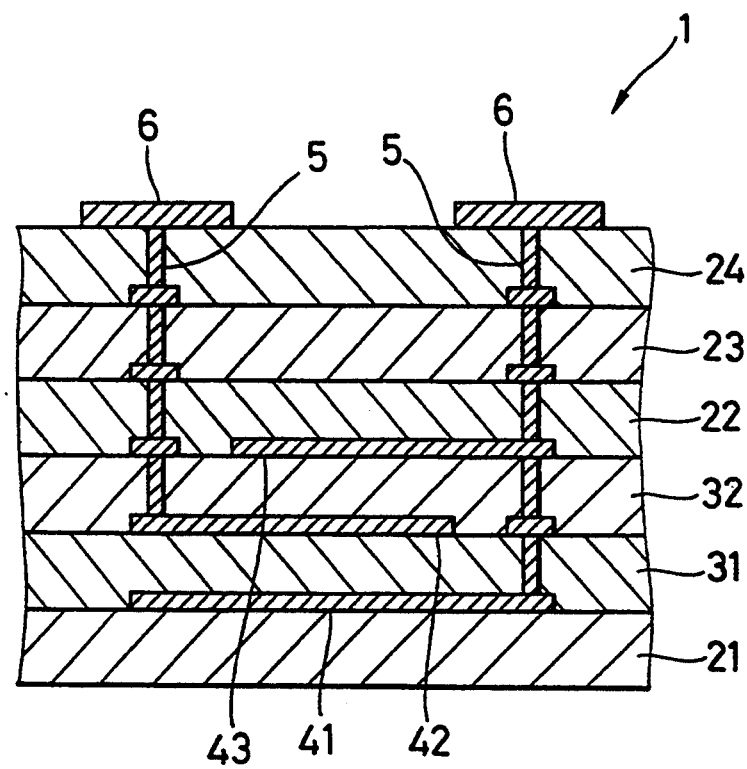
FIG. 1 is a cross-sectional view of one exemplary multilayer wiring substrate according to the invention.

The glass of the invention is used in dielectric compositions. The glass contains 10 to 40 mol %, preferably 15 to 25 mol % of a lanthanide oxide. The objects of the invention cannot be achieved outside this molar fraction range because below the range, a dielectric constant cannot be increased whereas vitrification becomes difficult beyond the range. The molar percentage of lanthanide oxide is calculated by converting it to $Ln_2O_3$ wherein Ln is a lanthanide element. The lanthanide used herein is at least one element selected from the group consisting of La, Ce, Pr, Nd, Pm, Sm, Eu, Gd, Tb, Dy, Ho, Er, Tm, Yb and Lu, with lanthanum (La) and neodymium (Nd) alone or in admixture being preferred. It will be understood that cerium oxide and praseodymium oxide have a stoichiometric composition $CeO_2$ and $Pr_6O_{11}$, respectively, and for those lanthanide oxides having a stoichiometric composition other than $Ln_2O_3$, their molar percentage can be calculated as that of $Ln_2O_3$. Unrefined or undressed rare earth ore may be used as a source material of lanthanide oxide.

The glass of the invention also contains 30 to 60 mol %, preferably 35 to 55 mol % in total of at least one glass-forming oxide selected from the group consisting of silicon dioxide, boron oxide and germanium oxide. The objects of the invention cannot be achieved outside this molar fraction range because no vitrification occurs or crystallized glass forms below the range whereas beyond the range, a low dielectric constant results. It is to be noted that the molar percentage is calculated by converting silicon dioxide, boron oxide and germanium oxide to $SiO_2$, $B_2O_3$ and $GeO_2$, respectively.

Additionally, the glass of the invention contains 16 to 40 mol %, preferably 20 to 30 mol % calculated as $Al_2O_3$ of aluminum oxide. Outside this molar fraction range, no vitrification occurs or crystallized glass forms.

Preferably, the glass contains the lanthanide oxide, glass-forming oxide, and aluminum oxide in a total amount of at least 80 mol %. If the total content is below this limit, the glass would be less desirable to provide all the advantages.

The glass may further contain at least one oxide selected from bismuth oxide and lead oxide. Bismuth oxide and lead oxide are effective for improving dielectric constant and bismuth oxide is especially so. The total content of bismuth oxide and lead oxide is up to 20 mol % of the glass because beyond this limit, the total content of the essential components (lanthanide oxide, glass-forming oxide and aluminum oxide) becomes too small to provide the advantages and the glass will have a lower softening point. It is to be noted that the molar percentage is calculated by converting bismuth oxide and lead oxide to $Bi_2O_3$ and PbO, respectively.

Since the glass of the invention generally has a glass transition temperature (Tg) of at least 600° C., it is effective for preventing dielectric layer separation and substrate warpage during firing of a dielectric composition. In order that the glass of the invention be applied to a dielectric composition and that a stack of dielectric layers and substrate layers be fired concurrently and integrally, the glass of the invention should preferably have a Tg of up to 800° C. A more preferred range of Tg is between 650° C. and 750° C.

The glass of the invention generally has an average coefficient of linear expansion of up to $7 \times 10^{-6}$/deg. over the temperature range of 25° to 500° C. The glass generally has a specific inductive capacity of at least 10 and it can be readily increased to 12 or more.

The present invention also provides a dielectric composition which contains the above-formulated glass and a dielectric material having a greater specific inductive capacity than the glass, both in powder form. The dielectric material used herein is not particularly limited and may be selected in accordance with the specific inductive capacity required for the dielectric composition by taking into the specific inductive capacity of glass, the mixing ratio with glass and the like. Preferred are dielectric materials having a specific inductive capacity of higher than 10, especially at least 20, for example, $TiO_2$ system materials and $BaO.nTiO_2$ system materials. Most preferred is $BaO.4TiO_2.Ln_2O_3$ commonly used as microwave dielectric material.

In the dielectric composition, the mixing ratio of the glass and the dielectric material is not particularly limited and may be determined in accordance with a desired firing temperature and their dielectric constant. Preferably the volume ratio of the glass to the dielectric material is from 8/2 to 4/6. A dielectric composition containing a higher proportion of glass would tend to have a lower dielectric constant and a lower deflective strength whereas a dielectric composition containing a lower proportion of glass would be difficult to fire concurrently with a substrate layer material.

Also provided by the present invention is a multilayer wiring substrate which includes substrate layers and dielectric layers in a stacking layer arrangement and has a capacitor or capacitors built therein.

The dielectric layers are formed by firing the dielectric composition defined above.

The substrate layers are formed by firing a substrate layer composition containing a filler and glass. The filler used herein is often aluminum oxide filler, typically $Al_2O_3$. The glass used herein is preferably alkaline earth silicate glass because of its strength and high-frequency response. In order that the firing temperature be lower than 1,000° C., it is preferred to use an alkaline earth silicate glass having Tg of about 650° to 850° C. Though not necessarily, glass having Tg above 850° C. is difficult to fire at a temperature lower than 1,000° C. whereas glass having Tg below 650° C. does not allow for effective binder removal during sheet forming, resulting in poor insulation. The preferred alkaline earth silicate glass includes strontium silicate system glasses such as strontium silicate glass and strontium alumina silicate glass. More preferred glass has a composition:

alkaline earth metal oxide(s): 25–45 mol %,
$SiO_2$: 50–70 mol %,
$Al_2O_3$: 5–20 mol %, and
$B_2O_3$: 0–10 mol %.

The alkaline earth metal oxides used herein are SrO as an essential component and one or both of CaO and MgO as an optional component. A mixture of these three oxides is preferred, with a mixture of 15 to 30 mol % of SrO, 1 to 8 mol % of CaO and 1 to 7 mol % of MgO based on the entire glass composition being especially preferred. Such a glass composition will have an average coefficient of linear expansion of about $6.0 \times 10^{-6}$ to $7.0 \times 10^{-6}$/deg. over the temperature range of 50° to 500° C. $Al_2O_3$ has an average coefficient of linear expansion of about $7.5 \times 10^{-6}$/deg. over the temperature range of 50 to 500° C. Understandably, Tg and an average coefficient of linear expansion can be measured by a differential thermal dilatometer.

In the substrate layers, the mixing ratio of aluminum oxide filler and glass is not particularly limited. Preferably the volume ratio of aluminum oxide to (aluminum oxide+glass) ranges from 0.2 to 0.5. Sinterability is low beyond this range whereas deflective strength is low below this range.

It is to be noted that the filler and glass may have a composition somewhat deviating from their stoichiometric composition. Mixtures of a stoichiometric composition and a deviated composition and mixtures of deviated compositions are also acceptable.

No particular limit is imposed on the particle size of the filler. Preferably the filler has a mean particle size of 0.5 to 3 μm because sheet formation would be difficult below the range and substrate and dielectric layers would become short in strength beyond the range. The glass preferably has a mean particle size of 1 to 2.5 μm for molding purpose.

Referring to FIG. 1, there is illustrated one exemplary arrangement of the multilayer wiring substrate according to the present invention. The multilayer wiring substrate generally designated at 1 includes substrate layers 21, 22, 23, 24 and dielectric layers 31, 32. Internal electrodes 41, 42 and 43 are disposed between substrate layer 21 and dielectric layer 31, between dielectric layers 31 and 32 and between dielectric layer 32 and substrate layer 22, respectively. The internal electrodes 41, 43 and 42 are electrically connected to external conductors 6 and 6 via conductors in through-holes 5 and 5, respectively, to form capacitors.

The internal electrodes and the conductor in the through-holes are preferably made of a silver or copper base conductive material because high conductivity is of first preference, with silver being especially preferred for firing in an oxygen-containing atmosphere, typically air. The external conductor is preferably made of a silver or copper base conductive material in view of anti-migration, solder leach and solderability, with a conductor containing Ag and Pd and/or Pt being especially preferred for firing in an oxygen-containing atmosphere, typically air.

In the practice of the invention, the multilayer wiring substrate is prepared by thick film methods, for example, sheeting and printing methods. In these methods, there are first prepared substrate and dielectric layer-forming pastes. The substrate layer paste is prepared by adding a vehicle to a substrate layer-forming composition and the dielectric layer paste is prepared by adding a vehicle to a dielectric layer-forming composition.

The vehicle used for these pastes may contain binders such as ethyl cellulose, polyvinyl butyral, methacrylic resins and butyl methacrylate, solvents such as terpineol, butylcarbitol, butylcarbitol acetate, toluene, alcohols and xylene, dispersants, activating agents, plasticizers and the like. Suitable ones may be selected from these components for a particular purpose. The vehicle is preferably added in an amount of about 65 to 85 parts by weight per 100 parts by weight of the total of filler and glass particles.

Separately, internal and external electrode-forming pastes are prepared. These pastes are prepared by mixing conductive particles with a vehicle and if desired, adding about 1 to 10% by weight of the conductive particles of glass frit.

In the sheeting method, green sheets to form dielectric layers and green sheets to form substrate layers are prepared. using the above-mentioned pastes, a predetermined number of green sheets are prepared by a doctor blade technique, for example. Then through-holes are formed in the green sheets using a punching machine or mold press. Thereafter, the internal electrode paste is printed on the respective green sheets by a screen printing technique, for example, to form a desired pattern of internal electrode while filling through-holes with the paste. Then the green sheets are stacked and hot pressed at, for example, about 40° to 120° C. and 50 to 1,000 kgf/cm² into a green sheet stack, which is removed of the binder and provided with cutting slits if desired.

The green sheet stack is then fired for integration in air at a temperature of up to 1,000° C., especially 800° to 1,000° C. for about 10 minutes. An external conductor is formed on the stack by printing the external conductor paste by a screen printing technique, for example, followed by firing. Preferably, the external conductor is formed by integrally firing it concurrently with the substrate layers and dielectric layers. Firing may be made at a temperature above the melting point of the conductor in the internal electrode paste, for example, about 1,200° to 1,300° C.

Although a printing method may be employed instead of the sheeting method mentioned above, the sheeting method is preferred because of high precision thickness control and reliability.

The multilayer wiring substrate of the invention is not Limited to the illustrated configuration and may be applied to other elements such as resonators by providing other necessary circuits such as inductors in addition to capacitors. For example, better results are obtained when the multilayer wiring substrate is used as a resonator adapted to operate in a frequency range of about 10 kHz to 10 GHz because the dielectric layers mentioned above offer an appropriate dielectric constant for such high-frequency resonators.

The dielectric composition of the invention is adequate for the manufacture of a multilayer ceramic capacitor which includes dielectric layers and internal electrodes in a layer arrangement. A paste containing the dielectric composition of the invention may be used for the dielectric layers, and an internal electrode paste as mentioned above may be used for the internal electrodes. Preferably the dielectric layers each have a thickness of up to 100 μm, more preferably up to 50 μm, most preferably 5 to 30 μm at the end of firing. The number of dielectric layers stacked is generally 2 to about 200.

The dielectric composition and the internal electrode material may be layered and integrated by either a green sheet method or a printing method. Layer stacking is followed by firing. After firing, a pair of external electrodes are provided in electrical connection with the internal electrodes. Any well-known material may be used as the external electrode material.

EXAMPLE

Examples of the invention are given below by way of illustration and not by way of limitation.

Example 1

A multilayer wiring substrate of the configuration shown in FIG. 1 was fabricated. First, a substrate layer paste was prepared by mixing glass frit having a mean particle size of 2 μm and $Al_2O_3$ having a mean particle size of 1.5 μm and adding a vehicle thereto. The volume ratio of glass frit to $Al_2O_3$ was 70/30. The glass frit had a composition: $SiO_2$ 62 mol %, $Al_2O_3$ 8 mol %, $B_2O_3$ 3 mol %, SrO 20 mol %, CaO 4 mol %, and MgO 3 mol % and its Tg was 765° C.

Separately, a dielectric layer paste was prepared by mixing glass frit having a mean particle size of 2 μm and a dielectric material having a mean particle size of 2 μm and adding a vehicle thereto. The composition, Tg, average coefficient of linear expansion (β) over the temperature range of 25° to 500° C., and specific inductive capacity ($\epsilon_r$) at 1 MHz of the glass frit used herein are reported in Table 1 together with the composition and $\epsilon_r$ of the dielectric material and the volume ratio of glass frit/dielectric material.

Measurement was done as follows. Tg was measured by thermal analysis. The average coefficient of linear expansion was measured by dry molding the glass frit into a bar and heat treating the bar at 850° C. for 10 minutes into a glass rod of 3.5 mm square and 15 mm high. The average coefficient of linear expansion of the glass rod was measured by a differential thermo-dilatometer. The specific inductive capacity was measured by preparing a glass disk of 15 mm diameter and 0.4 mm thick by the same heat treatment as above, printing Ag paste to both the major surfaces of the disk, and firing at 800° C. for 10 minutes to form electrodes.

Next, green sheets were formed from the respective pastes by a doctor blade technique. An internal electrode paste containing Ag was printed on the green sheets by a screen printing technique to form internal electrodes and fill through-holes with the conductor. Thereafter, the green sheets were stacked and compacted into a green sheet stack by means of a hot press. The stack was subject to binder removal and fired in air at 900° C. for 10 minutes. An external conductor paste containing Ag was printed on the stack by a screen printing technique and fired in air at 850° C. for 10 minutes. In this way, there were obtained multilayer wiring substrate samples having the configuration shown in FIG. 1 which had dimensions 50 mm×60 mm×1.0 mm.

Figure 2:
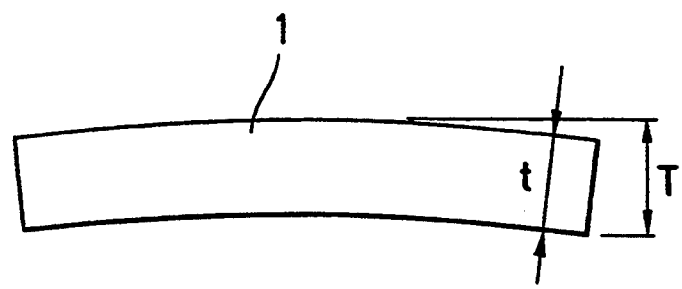
FIG. 2 illustrates how to calculate a warpage quantity.

Each sample was inspected whether cracks occurred or not after firing. A warpage quantity of each sample was determined as shown in FIG. 2 by measuring the distance T of the lowest edge from the upper surface of the substrate and the thickness t of the substrate, and calculating (T−t). The dielectric layer and substrate layer were measured for specific inductive capacity ($\epsilon_r$) at 1 MHz, A resistance to soldering heat test was carried out by dipping the sample in a solder bath at 350° C. The results are shown in Table 1.

TABLE 1

| | Multilayer wiring substrate | | | |
|---|---|---|---|---|
| | Dielectric layer glass | | | |
| Sample | Composition (mol %) | Tg | β | $\epsilon_r$ |
| 1 | $La_2O_3$(24)/$SiO_2$(32)/$B_2O_3$(10)/$Al_2O_3$(24)/$Bi_2O_3$(10) | 726 | 6.4 | 13.6 |
| 2* | $SiO_2$(62)/$Al_2O_3$(8)/$B_2O_3$(3)/SrO(20)/CaO(4)/MgO(3) | 765 | 6.15 | 7.3 |

| | Dielectric material | | Glass/dielectric |
|---|---|---|---|
| Sample | Composition (mol %) | $\epsilon_r$ | (volume ratio) |
| 1 | $BaO.4TiO_2.Nd_2O_3$ | 100 | 70/30 |
| 2* | $BaO.4TiO_2.Nd_2O_3$ | 100 | 70/30 |

| Sample | Crack | Warpage (mm) | Dielectric layer $\epsilon_r$ | Substrate layer $\epsilon_r$ | 350° C. solder |
|---|---|---|---|---|---|
| 1 | none | 0.08 | 24.7 | 7.5 | no crack |
| 2* | none | 0.10 | 16.0 | 7.5 | no crack |

*outside the scope of the invention

Example 2

A multilayer ceramic capacitor sample was fabricated.

First a dielectric layer paste was prepared by mixing glass frit having a mean particle size of 2 μm and a dielectric material having a mean particle size of 2 μm and adding a vehicle thereto. The composition, Tg, average coefficient of Linear expansion over the temperature range of 25° to 500° C., and specific inductive capacity ($\epsilon_r$) at 1 MHz of the glass frit used herein are reported in Table 2 together with the composition and $\epsilon_r$ of the dielectric material and the volume ratio of glass frit/dielectric material.

An internal electrode paste was prepared by mixing silver particles having a mean particle size of 1 μm and a vehicle. An external electrode paste was prepared by mixing silver and palladium particles both having a mean particle size of 1 μm, glass frit and a vehicle. The dielectric layer paste and the internal electrode paste were alternately layered by a printing technique to form a green chip. The number of dielectric layers was 10.

The green chip was cut to a predetermined size and fired in air at 900° C. for 10 minutes, yielding a capacitor chip.

The capacitor chip was polished on the side surfaces by sand blasting and the external electrode paste was transferred thereto. The chip was fired in air at 850° C. for 10 minutes to form external electrodes, yielding a multilayer ceramic chip capacitor sample which had dimensions: 3.2 mm×1.6 mm×1.2

The sample after firing was inspected for crack occurrence and delamination. The specific inductive capacity ($\epsilon_r$) at 1 MHz of the dielectric layer was measured. A resistance to soldering heat test was carried out as in Example 1. The results are shown in Table 2.

TABLE 2

| | Multilayer ceramic capacitor | | | |
|---|---|---|---|---|
| | Dielectric layer glass | | | |
| Sample | Composition (mol %) | Tg | β | $\epsilon_r$ |
| 1 | $La_2O_3$(24)/$SiO_2$(32)/$B_2O_3$(10)/$Al_2O_3$(24)/$Bi_2O_3$(10) | 726 | 6.4 | 13.6 |

Glass/

TABLE 2-continued

| | Multilayer ceramic capacitor | | |
|---|---|---|---|
| | Dielectric material | | dielectric |
| Sample | Composition (mol %) | $\epsilon_r$ | (volume ratio) |
| 1 | BaO.4TiO$_2$.Nd$_2$O$_3$ | 100 | 70/30 |

| Sample | Crack | Delamination | Dielectric layer $\epsilon_r$ | 350° C. solder |
|---|---|---|---|---|
| 1 | none | none | 24.7 | no crack |

*outside the scope of the invention

Advantages of the invention are evident form these examples.

I claim:

1. A dielectric composition comprising a glass comprising 10 to 40 mol % calculated as Ln$_2$O$_3$ of a lanthanide oxide wherein Ln is a lanthanide element, 30 to 60 mol % calculated as SiO$_2$, B$_2$O$_3$ and GeO$_2$ in total of at least one glass-forming oxide selected from the group consisting of silicon dioxide, boron oxide and germainium oxide, and 16 to 40 mol % calculated as Al$_2$O$_3$ of aluminum oxide, and a ceramic dielectric material having a higher specific inductive capacity than the glass.

2. The dielectric composition of claim 1 in which the glass contains said lanthanide oxide, said glass-forming oxide, and said aluminum oxide in a total amount of at least 80 mol %.

3. The dielectric composition of claim 1 in which the glass further contains up to 20 mol % calculated as Bi$_2$O$_3$ and PbO in total of at least one oxide selected from bismuth oxide and lead oxide.

4. The dielectric composition of claim 1 in which the glass has a glass transition temperature of at least 600° C.

5. The dielectric composition of claim 1 in which the glass has an average coefficient of linear expansion of up to $7 \times 10^{-6}$/deg. C. at 25° to 500° C.

6. The dielectric composition of claim 1 in which the glass has a specific inductive capacity of at least 10.

7. The dielectric composition of claim 1 wherein the volume ratio of said glass to said ceramic dielectric material is from 8/2 to 4/6.

8. The dielectric composition of claim 1, wherein the ceramic dielectric material has a specific inductive capacity of higher than 10.

9. The dielectric composition of claim 1, wherein the ceramic dielectric material comprises titanium oxide.

10. The dielectric composition of claim 1, wherein the ceramic dielectric material is TiO$_2$ system material or BaO—TiO$_2$ system material.

* * * * *